United States Patent
Gamand et al.

(10) Patent No.: US 8,178,901 B2
(45) Date of Patent: May 15, 2012

(54) INTEGRATED CIRCUIT ASSEMBLY WITH PASSIVE INTEGRATION SUBSTRATE FOR POWER AND GROUND LINE ROUTING ON TOP OF AN INTEGRATED CIRCUIT CHIP

(75) Inventors: Patrice Gamand, Douvres la Delivrande (FR); Jean-Marc Yannou, Colomby sur Thaon (FR); Fabrice Verjus, Creully (FR); Cyrille Cathelin, Caen (FR)

(73) Assignee: ST-Ericsson SA, Geneva (CH)

( * ) Notice: Subject to any disclaimer, the term of this patent is extended or adjusted under 35 U.S.C. 154(b) by 44 days.

(21) Appl. No.: 11/912,843

(22) PCT Filed: Apr. 26, 2006

(86) PCT No.: PCT/IB2006/051303
§ 371 (c)(1),
(2), (4) Date: Oct. 26, 2007

(87) PCT Pub. No.: WO2006/114772
PCT Pub. Date: Nov. 2, 2006

(65) Prior Publication Data
US 2008/0185614 A1    Aug. 7, 2008

(30) Foreign Application Priority Data
Apr. 28, 2005   (EP) .................................... 05300335

(51) Int. Cl.
*H01L 27/00* (2006.01)
(52) U.S. Cl. ........ 257/203; 257/686; 257/738; 257/778; 361/760; 361/783
(58) Field of Classification Search .................. 257/203, 257/666, 678, 686, 691, 738, 778, E27.07; 361/766, 760, 783
See application file for complete search history.

(56) References Cited

U.S. PATENT DOCUMENTS
5,023,750 A * 6/1991 Hirayama .................... 361/313
(Continued)

FOREIGN PATENT DOCUMENTS
DE        10152652 A1   4/2003
(Continued)

OTHER PUBLICATIONS
International Search Report and the Written Opinion of the International Searching Authority on Patentability for International Application No. PCT/IB2006/051303, mailed Jul. 8, 2006, pp. 14.
(Continued)

*Primary Examiner* — Long Tran
*Assistant Examiner* — Jordan Klein
(74) *Attorney, Agent, or Firm* — William J. Kubida; Peter J. Meza; Hogan Lovells US LLP

(57) ABSTRACT

An integrated circuit assembly (ICA) comprises: a digital and/or analog integrated circuit (S1) having a core with input and/or output pins and at least one power supply connection pad (PP) and one ground connection pad (GP) connected to a chosen one of the input and/or output pins and respectively connected to power supply and ground connection zones (MZ1) of a printed circuit board (PCB), and a passive integration substrate (S2) set on top of the digital and/or analog integrated circuit (S1) and comprising i) at least first and second input zones respectively connected to the ground (GP) and power supply (PP) connection pads to be fed with input ground and supply voltages, ii) input and/or output zones connected to chosen core input and/or output pins, and Ëi) a passive integrated circuit (PIC) connected to the first and second input zones and arranged to feed the substrate input and/or output zones with chosen ground and supply voltages defined from the input ground and supply voltages.

14 Claims, 3 Drawing Sheets

U.S. PATENT DOCUMENTS

Figure 1:
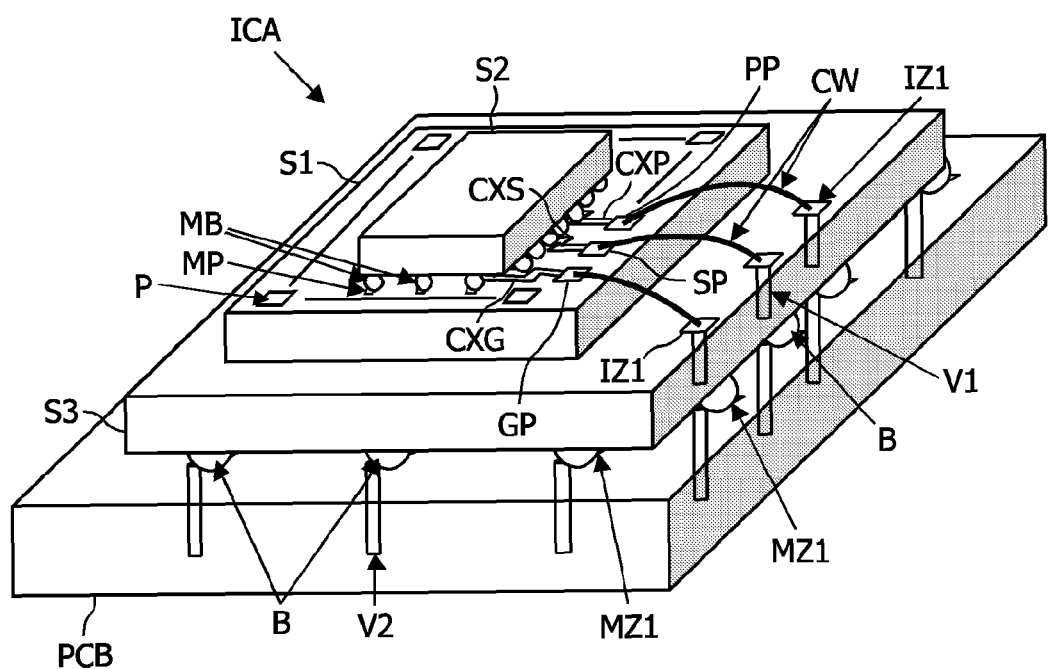

| | | | | |
|---|---|---|---|---|
| 5,633,785 | A * | 5/1997 | Parker et al. | 361/766 |
| 5,977,640 | A * | 11/1999 | Bertin et al. | 257/777 |
| 6,081,026 | A * | 6/2000 | Wang et al. | 257/700 |
| 6,294,407 | B1 * | 9/2001 | Jacobs | 438/118 |
| 6,313,587 | B1 * | 11/2001 | MacLennan et al. | 315/248 |
| 6,335,491 | B1 * | 1/2002 | Alagaratnam et al. | 174/260 |
| 6,521,530 | B2 * | 2/2003 | Peters et al. | 438/667 |
| 6,630,737 | B2 * | 10/2003 | Zhao et al. | 257/738 |
| 6,670,699 | B2 * | 12/2003 | Mikubo et al. | 257/678 |
| 6,707,680 | B2 * | 3/2004 | Schaper | 361/760 |
| 6,819,540 | B2 * | 11/2004 | Allen et al. | 361/302 |
| 6,849,940 | B1 * | 2/2005 | Chan et al. | 257/706 |
| 6,856,007 | B2 * | 2/2005 | Warner | 257/678 |
| 6,952,049 | B1 * | 10/2005 | Ogawa et al. | 257/700 |
| 7,049,692 | B2 * | 5/2006 | Nishimura et al. | 257/686 |
| 2001/0015497 | A1 | 8/2001 | Zhao et al. | |
| 2004/0012078 | A1 * | 1/2004 | Hortaleza | 257/678 |
| 2004/0125579 | A1 * | 7/2004 | Konishi et al. | 361/783 |
| 2004/0238934 | A1 * | 12/2004 | Warner et al. | 257/686 |
| 2005/0006730 | A1 * | 1/2005 | Owens et al. | 257/666 |

FOREIGN PATENT DOCUMENTS

| | | |
|---|---|---|
| EP | 1041631 A2 | 10/2000 |
| JP | 02-062069 | 1/1990 |
| JP | 2002-353325 | 6/2002 |
| JP | 2004-165558 | 10/2004 |

OTHER PUBLICATIONS

Japanese Office Action with English translation for application No. 2008-508397, mailed Jul. 9, 2010, pp. 6.

* cited by examiner

INTEGRATED CIRCUIT ASSEMBLY WITH PASSIVE INTEGRATION SUBSTRATE FOR POWER AND GROUND LINE ROUTING ON TOP OF AN INTEGRATED CIRCUIT CHIP

The present invention relates to the domain of integrated circuits, and more precisely to the connection of a digital and/or analog integrated circuit to a printed circuit board (PCB).

As is known to one skilled in the art, the data processing cores of integrated circuits (ICs) are generally surrounded with (connection) pads generally defining together an integrated pad ring. A pad is a cell which receives signals from the outside of the integrated circuit and drives them to the core through one of its input pins (or terminals) and/or drives the signals output by the core through one of its output pins (or terminals). So, the so-called "input pads" are each connected to at least one core input pin; the so-called "output pads" are each connected to at least one core output pin, and the so-called "bi-directional pads" are each connected to at least one core input/output pin as well as an output enable pin.

Cores of digital and/or analog ICs comprise an increasing number of input and/or output (I/O) pins. The number of pads surrounding these cores is also increasing. Systems-On-Chip frequently comprise several hundreds I/O pads.

Moreover, a digital and/or analog IC is provided with signals, supply voltage(s) and ground voltage(s) by a Printed Circuit Board (PCB), possibly through conducting balls and an intermediate substrate in case of a Ball Grid Array (BGA) structure. A PCB, at least one digital and/or analog IC, a possibly intermediate substrate of a BGA structure, together form an IC package or assembly. Such an assembly or package is notably disclosed in patent document US 2001/0015497.

Interconnection techniques, such as wire-bonding or bumping of ICs to the lead-frames or connection zones of the intermediate substrate or PCB of their respective packages have shrunk by a lesser factor than the core functions of the IC and therefore allow less miniaturization of the I/O pads on the pad ring.

Consequently, I/O pads now occupy a large part of the circuit and sometimes even determine the actual digital and/or analog core size because of space congestion in the pad ring. The circuit is then said to be "pad limited".

In addition, power distribution across the digital and/or analog IC via dedicated routing also occupies an increasing area of the IC as power consumption decreases by a smaller factor than the geometries of the logical functions. In fact, the addition of both the I/O pad ring area and the routing area inside a 0.090 µm CMOS process design may cover up to half the digital and/or analog IC total area. Therefore, costly state-of-the-art semiconductor technologies are now half used for trivial purposes such as power routing and I/O pad layout, due to limitations of the other surrounding technologies.

Moreover, digital applications require power supplies to be stabilized, and in the same time many circuit blocks inside the digital IC require their own ground voltage, or supply voltage or decoupling circuit in order to prevent interference and cross-talk and to improve immunity to noise.

These requirements may be obtained thanks to thorough decoupling all over the frequency spectrum with dedicated capacitors. These decoupling capacitors introduce parasitic connections, which are mainly of an inductive type. The inductors and the corresponding decoupling capacitors define LC circuits, which create several resonant frequencies. As these LC circuits act as low-pass filters, it is not possible to combine them into a single external LC circuit covering the full range of frequencies of interest. Therefore, an internal decoupling capacitor (few pF) is generally defined into the digital IC to allow for very high frequency decoupling, while first (typically 10 pF to 1 nF) and second (typically 10 nF to 100 nF) external decoupling capacitors are provided on the PCB to allow for medium and low frequency decoupling, respectively. Because of this arrangement the free areas on the digital IC are still reduced in size.

Furthermore, digital ICs are power consuming and produce heat, which needs to be dissipated cautiously. Now the heat dissipation is not optimal in the state-of-the-art IC assemblies or packages.

So, the object of this invention is to improve the situation at least partly.

For this purpose, it provides an integrated circuit assembly comprising a digital and/or analog integrated circuit having a core with input and/or output pins and at least one power supply connection pad and one ground connection pad connected to chosen one of these input and/or output pins and arranged to be connected to a power supply connection zone respectively and a ground connection zone of a printed circuit board (PCB).

This IC assembly is characterized in that it also comprises a passive integration substrate set on top of the digital and/or analog IC and comprising:
 at least first and second input zones respectively connected to the ground and power supply connection pads to be fed with input ground and supply voltages,
 input and/or output zones connected to chosen core input and/or output pins, and
 a passive integrated circuit connected to the first and second input zones and arranged to feed the substrate input and/or output zones with chosen ground and supply voltages defined from the input ground and supply voltages.

The IC assembly according to the invention may include additional characteristics considered separately or combined, and notably:
 its passive integration substrate may be disposed on top of the digital and/or analog integrated circuit S1 in a flipped position;
 its passive IC may comprise one or several capacitor means;
 its passive integrated circuit may comprise a first circuit dedicated to the definition of each chosen ground voltage, a second circuit dedicated to the definition of each chosen supply voltage, and a decoupling capacitor means connecting between the first and second circuits in order to decouple different chosen supply voltages;
 its passive integrated circuit may comprise at least one floating capacitor means connected between two input and/or output zones;
 its passive integration substrate may be made of a semi-insulating material or a semiconductor;
 its passive integration substrate may be made of silicon. In that case each capacitor means and/or each decoupling capacitor means and/or each floating capacitor means may be made of pores or trenches coated with a dielectric material and connected to electrodes;
 alternatively, each capacitor means and/or each decoupling capacitor means and/or each floating capacitor means may have a planar structure with a high dielectric constant;
 its digital and/or analog IC may comprise micropads connected to the chosen core input and/or output pins and to the ground and power supply connection pads respectively. In that case it may also comprise conducting microballs inserted between the digital and/or analog IC and the passive integration substrate and connecting the first and second input zones and the input and/or output zones respectively to the corresponding micropads;

its digital and/or analog IC may be disposed on top of an intermediate substrate comprising first intermediate connection zones connected to the power supply and ground connection pads and second intermediate connection zones connected to the first intermediate connection zones through vias and to the power supply and ground connection zones through conducting balls;

it may also comprise a printed circuit board having first main connection zones defining the power supply and ground connection pads and connected to the conducting balls, and second main connection zones connected to the first main connection zones through vias;

alternatively, it may comprise a printed circuit board (PCB) disposed on top of the passive integration substrate and comprising first main connection zones defining at least the power supply and ground connection zones and second main connection zones connected to these first main connection zones through vias, the first main connection zones being respectively connected at least to the power supply connection pad and ground connection pad of the digital and/or analog IC through conducting balls.

Figure 2:
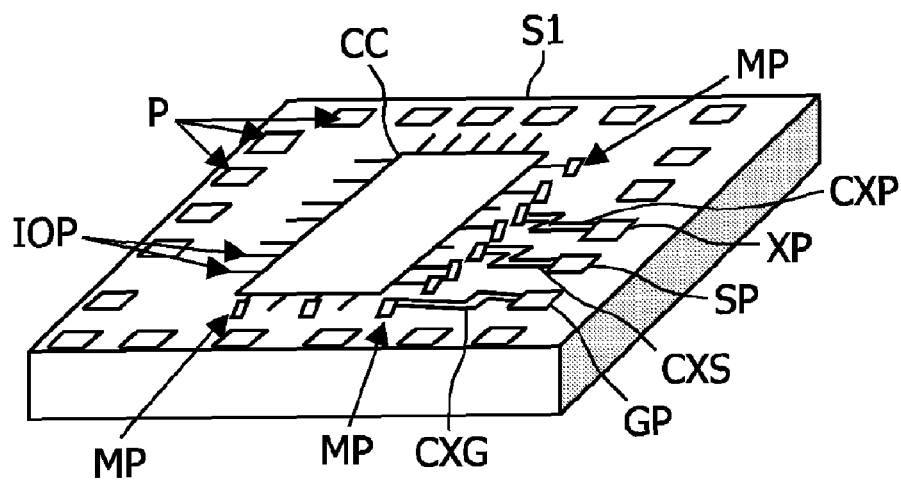
Figure 3:
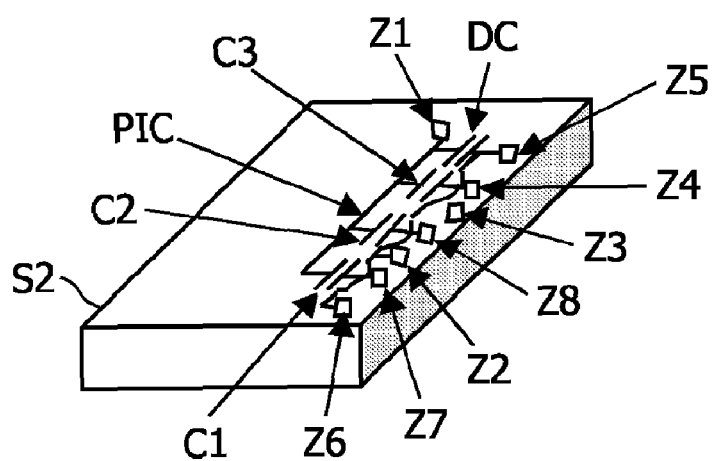
Figure 4:
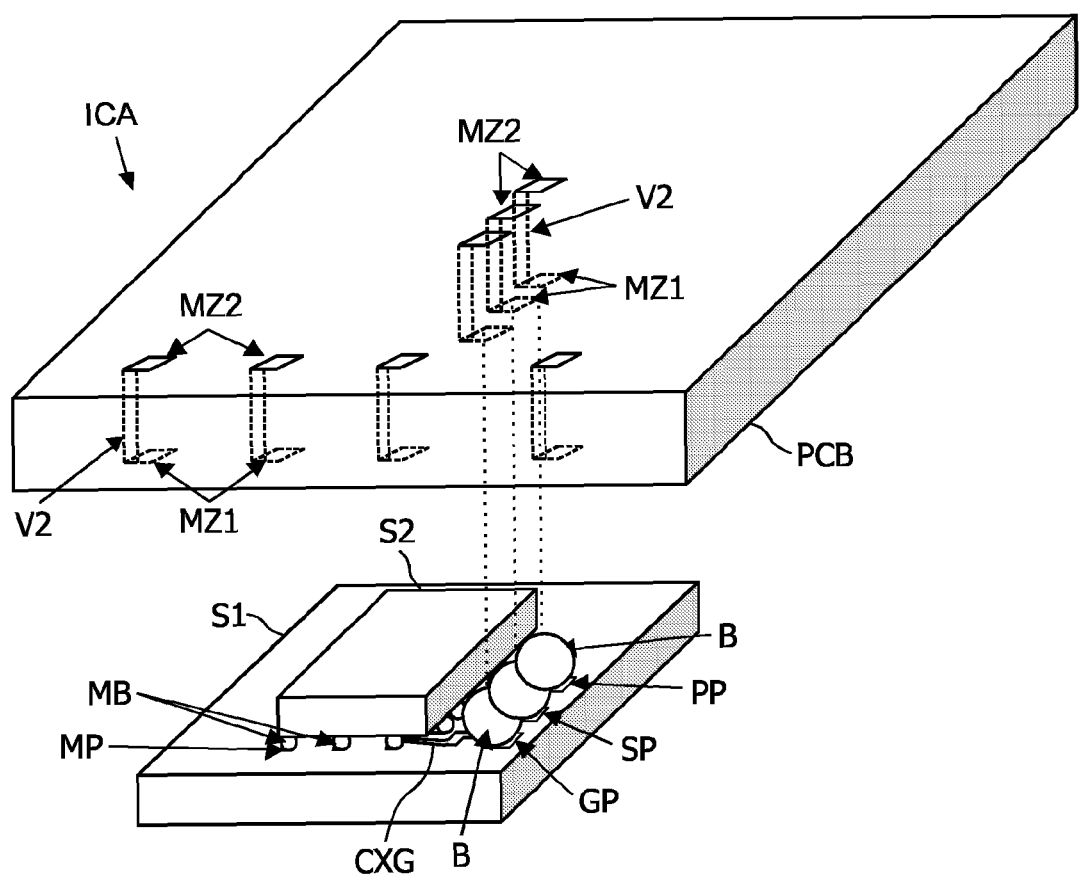

Other features and advantages of the invention will become apparent on examining the detailed specifications hereafter and the appended drawings, wherein:

FIG. 1 schematically illustrates a first example of a part of an integrated circuit assembly according to the invention, in a perspective view, FIG. 2 schematically illustrates the digital and/or analog integrated circuit of the integrated circuit assembly shown in FIG. 1, in a perspective view, FIG. 3 schematically illustrates the passive integration substrate of the integrated circuit assembly shown in FIG. 1, in a perspective view, and FIG. 4 schematically illustrates a second example of a part of an integrated circuit assembly according to the invention, in a perspective view.

The appended drawings may not only serve to complete the invention, but also to contribute to its definition, if need be.

Reference is initially made to FIGS. 1 to 3 to describe a first example of an integrated circuit assembly (or package) ICA according to the invention.

In the following description it will be considered that the integrated circuit assembly ICA is intended for mobile electronic equipment such as a mobile phone, for instance a GSM/GPRS or UMTS mobile phone. But it is important to notice that the invention is not limited to this type of electronic equipment. Indeed the invention may be applied to any type of electronic equipment comprising digital and/or analog integrated circuit(s).

As illustrated in FIG. 1, an integrated circuit assembly ICA according to the invention comprises at least a digital and/or analog integrated circuit S1 and a passive integration substrate S2 disposed on top of the digital and/or analog integrated circuit S1 in a flipped position.

As illustrated in FIG. 2 the digital and/or analog integrated circuit S1 comprises a digital and/or analog (chip) core CC surrounded at least partly by at least one integrated power supply connection pad PP (FIG. 1), one integrated ground connection pad GP and one signal connection pad SP. The chip core CC is dedicated to data (or signal) processing and comprises numerous input and/or output pins (or terminals) IOP to receive input signals (or data) to be processed and/or to deliver processed output signals (or data). Usually and as illustrated, the chip core CC is surrounded by an integrated pad ring comprising numerous input and/or output pads P among which the power supply connection pad PP, the ground connection pad GP and the signal connection pad SP.

Each core input and/or output pin IOP is connected to a connection pad P, PP, SP or GP either directly through "internal" connections (or paths or else lines) not shown or indirectly through the passive integration substrate S2. An integrated micropadmicropad MP is defined at the extremity of each core input and/or output pin IOP, that is not connected directly to a connection pad P.

As illustrated in FIGS. 1 and 2 the power supply connection pad PP, ground connection pad GP and signal connection pad SP are also connected to "internal" connections (or paths or else lines) referenced CXP, CXG and CXS, but these connections are terminated by an integrated micropadmicropad MP.

As illustrated in FIG. 3 the passive integration substrate S2 has at least first Z1 and second Z2 input zones and input and/or output zones Z3 to Z7. These zones Z1-Z7 are integrated micropadmicropads similar to the integrated micropads MP defined in the digital and/or analog integrated circuit S1.

The first input zone Z1 is connected to an input of a passive integrated circuit PIC defined in the passive integration substrate S2 and to the ground connection pad GP preferably through a conductive bump (or microball) MB located on the integrated micropad MP, which is defined at the extremity of the internal connection CXG (FIG. 4).

The second input zone Z2 is connected to another input of the passive integrated circuit PIC and to the power supply connection pad PP preferably through another conductive bump (or microball) MB located on the integrated micropad MP which is defined at the extremity of the internal connection CXP.

The input and/or output zone Z3 is connected to the signal connection pad SP preferably through another conductive bump (or microball) MB located on the integrated micropad MP which is defined at the extremity of the internal connection CXS. This zone Z3 is not mandatorily defined in the passive integration substrate S2 because the signal connection pad SP may be directly connected to the corresponding core signal input and/or output pin through the internal connection CXS. The passive integrated circuit PIC may also comprise a part dedicated to signal routing. In this case the input and/or output zone Z3 is also connected to the part of the passive integrated circuit PIC, which is dedicated to the signal routing.

The other input and/or output zones Z4 to Z7 are respectively connected to the core input and/or output pins IOP (see FIG. 2) that are terminated by an integrated micropad MP through another conductive bump (or microball) MB located on the corresponding integrated micropad MP.

The passive integrated circuit PIC is arranged to route at least the ground voltage, provided by the ground connection pad GP of the digital and/or analog integrated circuit S1, and the supply voltage, provided by the power supply connection pad PP of the digital and/or analog integrated circuit S1, in order to feed at least the substrate input and/or output zones Z4 to Z7 with chosen ground and supply voltages defined from the (input) ground and supply voltages. With such an arrangement several chosen core input and/or output pins IOP may be fed without being connected to respective corresponding connection pads P of the digital and/or analog integrated circuit S1, which vacates some place on said digital and/or analog integrated circuit S1.

The place that is vacated is all the more important as the number of core input and/or output pins IOP fed by the passive integration substrate S2 is important. It is to be recalled that the passive integration substrate S2 may also be used to route at least part of the signal to be processed to several dedicated input and/or output pins IOP of the digital and/or analog integrated circuit S1 and/or to route at least part of the signal processed by the core CC to one or more signal connection pads.

The passive integrated circuit PIC may comprise large highly conductive metal lines which route at least ground voltage(s) and supply voltage(s) with a very limited voltage drop. In the same way, with the place vacated on the digital and/or analog integrated circuit S1 the "internal" connections CXG, CXS and CXP may be large highly conductive metal lines with a very limited voltage drop.

In the non-limiting example of embodiment illustrated in FIGS. 1 to 3, the passive integrated circuit PIC is intended for outputting three different ground voltages, defined from the ground voltage feeding its first zone Z1, on three of its zones (Z4, Z7 and Z8).

For this purpose, the passive integrated circuit PIC comprises three branches (or a first circuit) connected in parallel to the first zone Z1 and to the output zones Z4, Z7 and Z8, and comprising a capacitor means C1, C2 or C3, respectively.

These capacitor means C1, C2 and C3 replace the state-of-the-art external decoupling capacitors that were previously used for medium and low-frequency decoupling. This arrangement vacates some place on the printed circuit board (PCB), which feeds digital and/or analog integrated circuit S1 with the (input) ground and supply voltages.

In the non limiting example of embodiment illustrated in FIGS. 1 to 3, the passive integrated circuit PIC is also intended for outputting on two of its zones (Z5 and Z6) the supply voltage feeding its second zone Z2.

For this purpose, the passive integrated circuit PIC comprises two branches (or a second circuit) connected in parallel to the second zone Z2 and to the output zones Z5 and Z6.

As is illustrated in FIG. 3, the passive integrated circuit PIC may also comprise a decoupling capacitor means DC connecting between the first and second circuits in order to decouple the supply voltages that are outputted on zones Z5 and Z6.

This decoupling capacitor means DC replaces the state-of-the-art internal decoupling capacitor that was previously used for high-frequency decoupling. This arrangement vacates some place on the digital and/or analog integrated circuit S1.

The type of capacitor means C1, C2 and C3 and decoupling capacitor means DC depends on the material in which the passive integration substrate S2 is made.

For instance the passive integration substrate S2 may be made of a semi-insulating material or a semiconductor.

A silicon material is advantageous because it allows manufacturing of pores or trenches which may define the capacitor means (C1, C2, C3 and DC) when they are coated with a dielectric material and connected to electrodes.

But it is also possible to define capacitor means (C1, C2, C3 and DC) having a planar structure with a high dielectric constant (K).

With these types of "built-in" capacitor means the assembly ICA is free of parasitic inductive effects between the capacitor means and the passive integration substrate S2 and digital and/or analog integrated circuit S1. In fact an inductive effect appears at very high frequencies (amply over 20 to 40 GHz), so well above the frequency range of most applications in the semiconductor industry.

Due to the very low series inductance of the pore (or trench) capacitor in the silicon substrate, the inductance can be neglected. Then capacitors C1 to C3 and DC can be combined to one group of capacitors, which further simplifies the assembly ICA.

In order to optimize the decoupling function depending on the frequency range of interest, the decoupling capacitor DC can be split between two capacitors, one on-chip and one off-chip. This is also made possible because the connection between the passive integration substrate S2 and the digital and/or analog integrated circuit S1 (with built-in decoupling capacitors) is made with bumps (or microballs) MB with practically no parasitic inductance.

A silicon substrate S2 flipped onto the digital and/or analog integrated circuit S1 is also advantageous because it acts as a heat spreader. The thermal resistance of the package (or assembly) circuit is therefore reduced, which improves the performance of the digital and/or analog integrated circuit S1 and reduces the complexity of the package.

In the non-limiting example of embodiment illustrated in FIGS. 1 to 3, the passive integration substrate S2 only comprises one passive integrated circuit PIC for routing one type of ground voltage and one type of supply voltage. But it may comprise several passive integrated circuits for routing several types of ground voltage and several types of supply voltage, if necessary. Moreover, the passive integrated circuit S2 may also comprise at least one floating capacitor means connected between two input and/or output zones (for instance between Z2 and Z7, or between Z2 and Z8).

As is illustrated in FIG. 1, the digital and/or analog integrated circuit S1 may be disposed on top of an intermediate substrate S3 itself located on a printed circuit board PCB with conducting balls sandwiched in between. Such an assembly constitutes what is named a Ball Grid Array (BGA) by the man skilled in the art.

In this case the intermediate substrate S3 comprises first intermediate connection zones IZ1 located on its upper face and respectively connected to the connection pads P and to the power supply connection pad PP, ground connection pad GP and signal connection pad SP through conducting wires (or lead-frames) CW. It also comprises second intermediate connection zones (not shown) located on its lower face and connected to the first intermediate connection zones IZ1 through vias V1.

The printed circuit board PCB comprises first main connection zones MZ1 located on its upper face and respectively connected to the second intermediate connection zones of the intermediate substrate S3 through conducting balls B. These first main connection zones MZ1 define notably the power supply connection zone, ground connection zone and signal connection zone which are fed by the power supply connection pad PP, ground connection pad GP and signal connection pad SP respectively of the digital and/or analog integrated circuit S1.

The printed circuit board PCB also comprises second main connection zones (not shown) located on its lower face and respectively connected to the first main connection zones MZ1 through vias V2.

Preferably, the digital and/or analog integrated circuit S1 is realized in CMOS or Bi-CMOS technology.

In a variant illustrated in FIG. 4 the printed circuit board PCB may be directly located on top of the passive integration substrate S2 (or reversely the passive integration substrate S2 (with the digital and/or analog integrated circuit S1 set on it) may be directly located on top of the printed circuit board PCB). Such an assembly constitutes what is named a Wafer Level Package (WLP) by the man skilled in the art.

The printed circuit board PCB comprises first main connection zones MZ1 located on a first face (facing said passive integration substrate S2) and connected to the power supply connection pad PP, ground connection pad GP and signal connection pad SP respectively of the digital and/or analog integrated circuit S1 through conducting balls B. These first main connection zones MZ1 define notably the power supply connection zone, ground connection zone and signal connection zone.

The printed circuit board PCB also comprises second main connection zones MZ2 located on a second face (opposite said first face) and respectively connected to the first main connection zones MZ1 through vias V2.

By the use of a passive integration substrate flipped on top of a digital and/or analog integrated circuit the invention allows the routing of the main power and ground lines to different parts of the digital and/or analog integrated circuit. A very reduced amount of power and ground I/O pads remains in the pad ring of the digital and/or analog integrated circuit, which vacates a lot of space. This vacated space allows either the use of a digital and/or analog integrated circuit with higher complexity (more pads) or the use of a smaller BGA.

The invention is not limited to the embodiments of integrated circuit assembly (or package) described above, only by way of example, but it includes all alternative embodiments which may be considered by one skilled in the art within the scope of the claims hereafter.

The invention claimed is:

1. Integrated circuit assembly (ICA), comprising:
a digital and/or analog integrated circuit, comprising:
   a core;
   input and/or output pins coupled to the core;
   at least one power supply connection pad and one ground connection pad connected to one of said input and/or output pins and respectively connected to a power supply connection zone and a ground connection zone of a printed circuit board (PCB);
a passive integration substrate arranged in a flipped position on said digital and/or analog integrated circuit, comprising:
   first and second input zones respectively connected to said ground and power supply connection pads;
   input and/or output zones connected to core input and/or output pins; and
   a passive integrated circuit connected to said first and second input zones and configured to provide said substrate input and/or output zones with ground and supply voltages; and
an intermediate substrate wherein the digital and/or analog integrated circuit is arranged on an intermediate substrate, wherein the intermediate substrate comprises:
   first intermediate connection zones connected to said power supply and ground connection pads and second intermediate connection zones connected to said first intermediate connection zones through vias and to said power supply and ground connection zones through conducting balls.

2. The integrated circuit assembly of claim 1, wherein said passive integrated circuit further comprises at least one capacitor means.

3. The integrated circuit assembly of claim 2, wherein said capacitor means are planar structures with a high dielectric constant.

4. The integrated circuit assembly of claim 2, wherein said capacitor means comprises pores or trenches coated with a dielectric material and connected to electrodes.

5. The integrated circuit assembly of claim 1, wherein said passive integrated circuit further comprises:
   a first circuit dedicated to the definition of each chosen ground voltage;
   a second circuit dedicated to the definition of each chosen supply voltage; and
   a decoupling capacitor means connecting said first circuit to said second circuit in order to decouple different supply voltages.

6. The integrated circuit assembly of claim 5, wherein said decoupling capacitor means comprises pores or trenches coated with a dielectric material and connected to electrodes.

7. The integrated circuit assembly to of claim 5, wherein said decoupling capacitor means comprises planar structures with a high dielectric constant.

8. The integrated circuit assembly of claim 1, wherein said passive integrated circuit further comprises at least one floating capacitor means connected between the two input and/or output zones.

9. The integrated circuit assembly of claim 8, wherein said floating capacitor means comprises pores or trenches coated with a dielectric material and connected to electrodes.

10. The integrated circuit assembly of claim 8, wherein said floating capacitor means comprises planar structures with a high dielectric constant.

11. The integrated circuit assembly of claim 1, wherein said passive integration substrate comprises at least one of semi-insulating material or a semiconductor material.

12. The integrated circuit assembly of claim 11, wherein said passive integration substrate comprises silicon.

13. The integrated circuit assembly of claim 1, wherein said digital and/or analog integrated circuit comprises micro pads respectively connected to said chosen core input and/or output pins and to said ground and power supply connection pads; and
   conducting micro-balls inserted between said digital and/or analog integrated circuit and said passive integration substrate and connecting said first and second input zones and said input and/or output zones respectively to the corresponding micro pads.

14. The integrated circuit assembly of claim 1, wherein said printed circuit board, comprises:
   first main connection zones defining at least said power supply and ground connection zones and second main connection zones connected to said first main connection zones through vias, said first main connection zones being respectively connected at least to said power supply connection pad and ground connection pad of said digital and/or analog integrated circuit through conducting balls.

* * * * *

UNITED STATES PATENT AND TRADEMARK OFFICE
CERTIFICATE OF CORRECTION

Page 1 of 1

PATENT NO. : 8,178,901 B2
APPLICATION NO. : 11/912843
DATED : May 15, 2012
INVENTOR(S) : Patrice Gamand et al.

It is certified that error appears in the above-identified patent and that said Letters Patent is hereby corrected as shown below:

Column 8, line 19, delete "to"

Signed and Sealed this
Eleventh Day of September, 2012

David J. Kappos
*Director of the United States Patent and Trademark Office*